(12) United States Patent
Bonin

(10) Patent No.: US 7,915,890 B2
(45) Date of Patent: Mar. 29, 2011

(54) HIGH SENSITIVITY MAGNETIC SENSOR

(75) Inventor: Wayne Allen Bonin, North Oaks, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 450 days.

(21) Appl. No.: 12/144,175

(22) Filed: Jun. 23, 2008

(65) Prior Publication Data

US 2009/0315548 A1  Dec. 24, 2009

(51) Int. Cl.
  *G01R 33/02* (2006.01)
  *G01R 33/07* (2006.01)
  *G01R 33/09* (2006.01)

(52) U.S. Cl. .......................... 324/244; 324/251; 324/252

(58) Field of Classification Search .................. 324/244, 324/247, 249, 251, 252, 260
  See application file for complete search history.

(56) References Cited

U.S. PATENT DOCUMENTS

| | | | | |
|---|---|---|---|---|
| 4,587,509 A | * | 5/1986 | Pitt et al. ...................... | 338/32 H |
| 5,942,895 A | * | 8/1999 | Popovic et al. ................ | 324/251 |
| 6,501,268 B1 | * | 12/2002 | Edelstein et al. ............. | 324/244 |
| 6,670,809 B1 | * | 12/2003 | Edelstein et al. ............. | 324/244 |
| 7,046,002 B1 | | 5/2006 | Edelstein | |
| 7,112,957 B2 | | 9/2006 | Bicking | |
| 7,185,541 B1 | * | 3/2007 | Edelstein ..................... | 73/514.16 |
| 7,195,945 B1 | * | 3/2007 | Edelstein et al. ............... | 438/48 |
| 7,242,183 B2 | * | 7/2007 | Recio et al. .............. | 324/207.24 |

OTHER PUBLICATIONS

Drljaca et al. Design of Planar Magnetic Concentrators for High Sensitivity Hall Devices, Sensors and Actuators, 97-98 (2002), pp. 10-14.*
Edelstein et al., Minimizing 1/F Noise in Magnetic Sensors Using Microelectromechanical System Flux Concentrator, Journal of Applied Physics, vol. 9, No. 10 (2002), pp. 7795-7797.*
Alan Edelstein, Technique for Minimizing the Effect of 1/f Noise in Magnetic Sensors, Abstract Submitted for the MAR08 meeting of the American Physical Society, Nov. 26, 2007.

* cited by examiner

*Primary Examiner* — Kenneth J Whittington
(74) *Attorney, Agent, or Firm* — Campbell Nelson Whipps

(57) ABSTRACT

A sensor device comprising a base substrate and first and second flux concentrator fixedly attached to the base substrate. The first flux concentrator and the second flux concentrator are positioned with their proximal end regions facing and spaced apart, defining a gap therebetween. A magnetic sensor element is positioned in the gap, the sensor element moveable towards and away from the base substrate. The sensor device has a first system to offset stray magnetic fields, a second system to modulate the sensor element to detect KHz frequency, and a third system to dither noise from the first and second flux concentrators.

20 Claims, 1 Drawing Sheet

HIGH SENSITIVITY MAGNETIC SENSOR

BACKGROUND

There are several applications that operate based on the detection of extremely small magnetic fields, on the order of a few picotesla at DC to a few Hz frequency range. Cardiac magnetic signal detection for biomedical uses is one such application. Military installations are another application for the detection of extremely small magnetic fields. For example, an armed soldier at several hundred meters can be detected and identified by the signature magnetic field.

Giant magnetoresistance (GMR) and similar magnetic sensor elements developed for use in magnetic recording heads are very sensitive and their sensitivity can be increased by the addition of flux concentrators to create a sensor device. Magnetoresistance sensor devices are low cost because they can be mass produced by batch processing on silicon wafers and the drive and read out electronics are relatively simple. The resistance within a magnetoresistance sensor device is sensitive to the magnitude and direction of a magnetic field external to the sensor device. To detect the relative motion between the desired target and the magnetic sensor generally requires high sensitivity in the frequency range below a few Hz.

Unfortunately, most magnetoresistance sensor devices tend to suffer from 1/f noise, which is common phenomena in electronic devices and sensors, where the noise level per unit of signal bandwidth is roughly proportional to the reciprocal of the frequency, which severely limits the effectiveness of noise reduction by bandwidth reduction at very low frequencies. Furthermore, there is generally a tendency for those sensor devices that have a more sensitive response to magnetic fields to also have more 1/f noise. Magnetization fluctuations in magnetoresistive heads tend to be a fundamental limit on their signal-to-noise ratio. The 1/f noise of the sensor devices themselves prevents obtaining the desired sensitivity for the possible bandwidth, as the noise at 1 Hz is several orders of magnitude greater than at several KHz.

Various attempts have been made to reduce the sensor 1/f noise by shifting the DC magnetic signal to the frequency of a mechanical oscillation of the flux concentrator spacing. Although this does reduce the 1/f noise from the sensor element, the noise from the flux concentrators remains and is not reduced. Furthermore, applying the motion to the flux concentrators makes it impractical to use large flux concentrators which would have a larger concentration ratio than smaller sized concentrators.

BRIEF SUMMARY

The present disclosure relates to a sensor device that includes a magnetic sensor element that vibrates in relation to a pair of flux concentrators in order to reduce the effect of 1/f noise in the sensor device. Noise in the sensor device is reduced by a fixed separation between the sensor element and the flux concentrators and also by a dither current modulation at a frequency above the vibration frequency of the sensor element.

In one particular embodiment of this disclosure, a sensor device has a base substrate and first and second flux concentrator fixedly attached to the base substrate. The first flux concentrator and the second flux concentrator are positioned with their proximal end regions facing and spaced apart, defining a gap or space therebetween. A magnetic sensor element is positioned between proximal end regions, the sensor element moveable towards and away from the base substrate. The sensor device has a first system to offset stray magnetic fields, and a second system to modulate the position of the sensor element to shift the desired low frequency magnetic field sensitivity from near DC to a higher frequency, such as 1 to 10 KHz. In some embodiments, the sensor device may have a third system to dither noise from the first and second flux concentrators.

BRIEF DESCRIPTION OF THE DRAWINGS

The invention may be more completely understood in consideration of the following detailed description of various embodiments of the invention in connection with the accompanying drawings, in which.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

Figure 1:
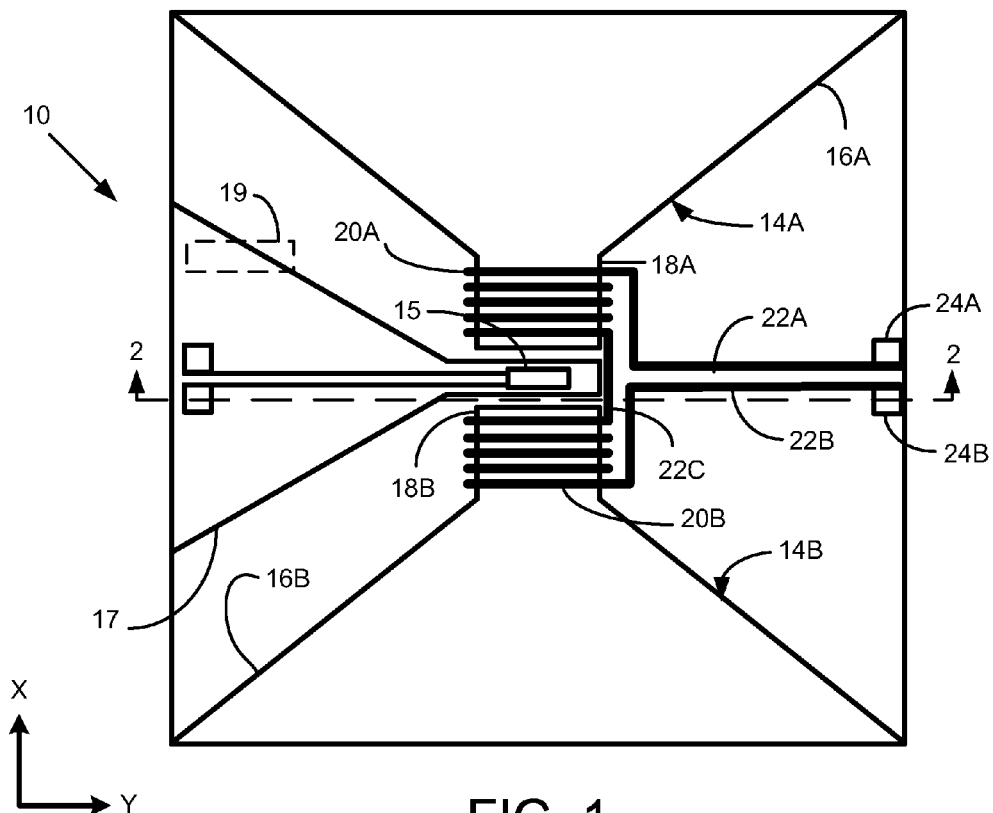
FIG. 1 is a schematic top view of a high sensitivity magnetic sensor device according to this disclosure.

The following description provides an improved, ultrahigh sensitivity magnetic sensor device in which a magnetic sensor element is oscillated in and out of a gap between two stationary flux concentrators, with the sensor device signal being demodulated to reduce 1/f noise. The stationary flux concentrators may be sized to provide a flux concentration ratio of about 10 to 1000 or more. Stray magnetic fields, such as the earth's magnetic field, are offset by DC current through a coil around the flux concentrator. Noise from the flux concentrators is dithered by AC current modulation in the coil around the flux concentrator. Electrostatic actuation of the sensor element between the flux concentrators modulates the field at the sensor element and thus increases the frequency of the field seen by the sensor element to kHz frequencies where the 1/f noise is much smaller.

In one particular embodiment, this disclosure provides a sensor device having a base substrate and a first flux concentrator and a second flux concentrator fixedly attached to the base substrate, each of the concentrators having a length extending from a proximal end to a distal end. The flux concentrators are positioned with the proximal ends facing to create a gap therebetween. A first coil is wound around the first flux concentrator at its proximal end and an AC current source electrically connected to the first coil. A magnetic sensor element is positioned in the space between the proximal ends of the flux concentrators, the sensor element being moveable towards and away from the base substrate. In some embodiments, a DC current source may be electrically connected to the first coil. In yet other embodiments, the sensor device includes a second coil wound around the second flux concentrator at its proximal end, an AC current source electrically connected to the second coil, and a DC current source electrically connected to the second coil. The sensor device may include an electrostatic or other type of actuator operably connected to the magnetic sensor element to move the sensor element towards and away from the base substrate, which may be vertically in and out of the gap.

In another particular embodiment, this disclosure provides a sensor device comprising a base substrate with a first flux concentrator and a second flux concentrator fixedly attached to the base substrate, each of the concentrators having a length extending from a proximal end to a distal end, the flux concentrators defining a gap between their proximal ends. A moveable magnetic sensor element is positioned between the proximal ends of the flux concentrators, the magnetic sensor element movable from a first position within the gap to a second position above the gap. An electrostatic actuator element is operably connected to the magnetic sensor element to move the sensor element. In some embodiments, the sensor device may also have a first coil wound around the first flux concentrator at its proximal end and an AC current source electrically connected to the first coil, and also a second coil wound around the second flux concentrator at its proximal end and an AC current source electrically connected to the second coil. A DC current source may be electrically connected to the first coil and to the second coil. The coils may be connected in series or parallel, and the AC and DC signals may be electrically combined and applied to the coils by a single current source.

In the following description, reference is made to the accompanying set of drawings that form a part hereof and in which are shown by way of illustration a specific embodiment. It is to be understood that other embodiments are contemplated and may be made without departing from the scope or spirit of the present invention. The following detailed description, therefore, is not to be taken in a limiting sense. Referring now to the figures, a sensor device 10 according to the present invention is schematically illustrated.

Sensor device 10 has a base substrate 12 and a pair of flux concentrators, specifically flux concentrators 14A, 14B, fixedly mounted on substrate 12. It should be understood that throughout the following description, elements having a reference numeral with an "A" suffix are for the first flux concentrator (i.e., flux concentrator 14A) and elements having a reference numeral with a "B" suffix are for the second flux concentrator (i.e., flux concentrator 14B). In some embodiments, flux concentrators 14A, 14B are identical and mirror images of each other. In other embodiments, flux concentrators 14A, 14B are different; for example, one of the flux concentrators have more or less features than the other flux concentrator, or for example, may have a different size and/or shape, or for example, be made from different material.

Each flux concentrator 14A, 14B has a distal end region 16A, 16B progressing to a proximal end portion 18A, 18B, respectively. Distal end regions 16A, 16B are positioned at the outer portions of sensor device 10 and proximal end portions 18A, 18B are positioned toward the center of sensor device 10. Together, flux concentrators 14A, 14B have a longest length, in the X-direction, from distal end region 16A to distal end region 16B to of about 10 micrometers to 20 mm, although larger and smaller configurations would be within the scope of this disclosure. In some embodiments, the total length of flux concentrators 14A, 14B is about 100 micrometers to 10 mm. Flux concentrators 14A, 14B are positioned with proximal end portions 18A, 18B facing yet spaced from each other in the X-direction. The space or distance between proximal end portions 18A, 18B is usually about 1 micrometer to 2 mm, in some embodiments, about 10 micrometers to 1 mm.

Flux concentrators 14A, 14B may be made from materials having a high magnetic permeability and low coercivity and optionally having near zero magnetostriction. Examples of suitable materials include those materials known as permalloys, alloys of Ni—Fe. Flux concentrators 14A, 14B may comprise a single layer of a material or may be multiple layers, for example thin layers of soft ferromagnetic material separated by electrically insulating spacer material, to reduce eddy currents and thereby increase the high frequency permeability. Any of the layers may be composites of materials. Any residual magnetic fields from flux concentrators 14A, 14B, or from external fields other than those being monitored, such as the earth's field, can be offset or reduced, as described below.

Around at least one of proximal end portion 18A, 18B is a coil 20A, 20B, respectively. In the illustrated embodiment, each proximal end portion 18A, 18B has a coil with five wraps therearound. In most embodiments, coils 20A, 20B will have from two to 100 wraps or more. Coils 20A, 20B are electrically conductive and are connected via traces 22A, 22B to electrode pads 24A, 24B, and to each other by trace 22C. Each of coils 20A, 20B, traces 22A, 22B, 22C and pads 24A, 24B is formed from an electrically conducting material, typically metal. Examples of suitable metals for coils 20A, 20B, traces 22A, 22B and pads 24A, 24B include copper (Cu), aluminum (Al), silver (Ag) and gold (Au). Electrode pads 24A, 24B are electrically connected to a current source (not illustrated).

Application of DC current to coils 20A, 20B produces a magnetic field through flux concentrators 14A, 14B that can cancel or offset the earth's magnetic field and other stray magnetic fields sensed by sensor device 10. In some embodiments, a coil present on only one of flux concentrators 14A, 14B is needed to sufficiently cancel or offset the undesired fields. Application of AC current to coils 20A, 20B dithers noise from flux concentrators 14A, 14B, as further described below. The AC current may be superimposed on the DC current, and applied simultaneously by the same current source. A voltage source may alternatively be used to supply the current.

Present between flux concentrators 14A, 14B is a magnetic sensor element 15 generally fixed in the X-direction from proximal end portions 18A, 18B. Magnetic sensor element 15 is supported by a cantilever 17, movable in the Z-direction, toward and away from substrate 12. In some few embodiments, sensor element 15 may have some movement in the X-direction. The inventive concepts of this disclosure can be used with other suspended sensor element configurations and are not limited to cantilevered sensor elements. For example, the concepts could be used with a cross-beam support. Some examples of a cross-beam support which could be used with the concepts herein are described in Applicant's co-pending patent application Ser. No. 12/119,717 filed May 13, 2008. Operably connected to cantilever 17 is an actuator 19 to move sensor element 15. Actuator 19 may be an electrostatic actuator, or other actuator type, such as piezoelectric.

Figure 2:
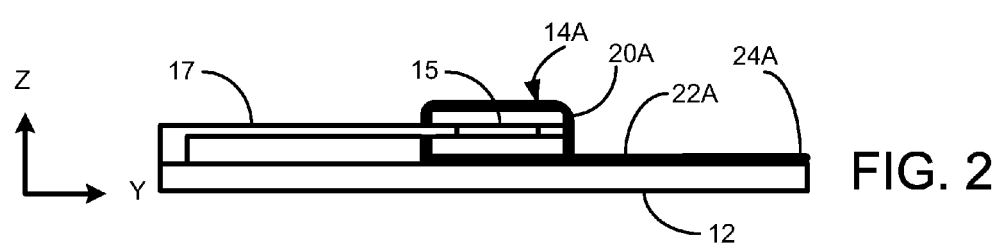
FIG. 2 is a side view of the high sensitivity magnetic sensor device taken along line 2-2 of FIG. 1.
Figure 3:
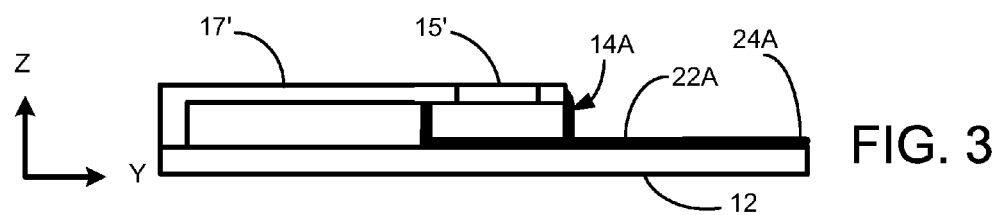
FIG. 3 is a side view of an alternate embodiment of a high sensitivity magnetic sensor device.

Sensor element 15 is movable vertically within the space between proximal end portions 18A, 18B. In some embodiments, sensor element 15 is limited to movement between the substrate and the top level of flux concentrators 14A, 14B. In other embodiments, sensor element 15 is movable out from the volume between proximal end portions 18A, 18B; in other words, sensor element 15 is movable above the top level of flux concentrators 14A, 14B. Typically, sensor element 15 has a movement range, in the Z-direction, of at least about 0.5 micrometer, in some embodiments at least about 1 mm, and in other embodiments at least about 2 mm. In FIG. 2, the zero location, neutral position or the like for sensor element 15 is at the approximate center (in the Z-direction) of the flux concentrator. From this zero location, sensor element 15 may, in some embodiments, moved to above the level of flux concentrators 14A, 14B. In some embodiments, the desired zero location, neutral position or the like for sensor element 15 is approximately level with the top level of flux concentrators 14A, 14B; see FIG. 3, which illustrates sensor element 15' held approximately level with flux concentrator 14A by cantilever support 17'. At this location, sensor element 15' is considered to be between the ends of the flux concentrators. From this position, sensor element 15' approaches either the maximum or minimum magnetic field level, depending on the direction of movement of sensor element 15'. In some embodiments, sensor element 15, 15' is positioned at a location having, if the magnetic field versus position were graphed, the maximum slope on that graph.

Magnetic sensor element 15 can be a magnetoresistive element, having a Wheatstone electrical bridge configuration. When the resistance of magnetoresistive element 15 changes because of a magnetic field, the bridge output voltage changes. The change in the bridge output is increased by using flux concentrators 14A, 14B. The bridge output voltage is modulated at a resonant frequency by actuator 19. The signal can then be amplified by a narrow band amplifier and then demodulated. The bandwidth of the amplifier only has to be broad enough to include the low frequencies in the original signal coming into flux concentrators 14A, 14B. Alternately, magnetic sensor element 15 can be a Hall-effect device (e.g., having three or four electrical leads with current or voltage electrodes arranged on one side or on each side of a rectangle). When a Hall-effect device is used, an output voltage from such a device results from the Lorentz force of the magnetic field acting on charge carriers within such a device. Other types of magnetic sensors that can be used other than Hall-effect devices include flux gate magnetometers and magnetoresistive sensors that include anisotropic magnetoresistive sensors, giant magnetoresistive sensors, spin dependent tunneling sensors, and bismuth, magnetostrictive sensors, and MEMS sensors.

Magnetic sensor element 15 is operably connected to sensing circuitry (not illustrated) to determine movement of sensor element 15 in the Z-direction.

As indicated above, connected to sensor element 15 is actuator 19 to modulate sensor element 15 at a desired frequency in the Z-direction. Moving magnetic sensor element 15 while keeping the position of flux concentrators 14A, 14B fixed in relation to substrate 12 modulates the field at sensor element 15 to increase the frequency of the field to be detected, thus inhibiting noise from corrupting the signal from sensor element 15. The signal from sensor element 15 is shifted by the position modulation from near DC (e.g., about 0 to 1 Hz) to kHz frequencies, where the 1/f noise is much smaller.

Additionally, by moving sensor element 15 rather than flux concentrators 14A, 14B, the magnetic field ratio, which is approximately the concentrator length divided by the gap length between the concentrators, can be larger than if the flux concentrators were movable. By having the sensor element 15 moveable in the Z-direction, the gap needed between concentrators 14A, 14B to ensure clearance of the moveable sensor element 15 can be minimized. In most embodiments, flux concentrators 14A, 14B have a total length about 10 to 1000 times longer than the gap between proximal ends 18A, 18B, providing a magnetic field concentration ratio of about 10:1 to 1000:1.

As mentioned above, application of DC current to coils 20A, 20B produces a magnetic field through flux concentrators 14A, 14B that offsets the earth's magnetic field and other stray magnetic fields. Application of AC current to coils 20A, 20B dithers noise from flux concentrators 14A, 14B at a frequency separated from both the DC signal at sensor element 15 and the sensor modulation frequency provided via electrostatic actuator 19. The dithering may be accomplished by means of a small AC current applied to coils 20A, 20B surrounding flux concentrators 14A, 14B through traces 22A, 22B from electrode pads 24A, 24B. This dithering reduces the possible noise or possibility of non-responsiveness of flux concentrators 14A, 14B to nanotesla fields due to Barkhausen effects, and other imperfections in the magnetic response of the flux concentrators.

The frequency of the dither current is preferably significantly higher (e.g., at least about 10 times higher, often 100 to 1000 times higher) than the mechanical modulation frequency of sensor element 15 by actuator 19. For example, for a mechanical vibration frequency of 10 KHz, the desired dither current frequency would be at least about 100 KHz, with 1 MHz to 10 MHz being more desirable, to provide a large frequency separation between the data carrier frequency (10 KHz before demodulation) and any noise generation by the dithering. The Barkhausen effect noise or other noise will then be shifted to well about the frequency of the desired signal, allowing the noise to be filtered out without attenuating the desired signal.

The magnetic sensor devices of this invention can be built using semiconductor fabrication techniques or using manual or mechanical techniques, depending on the size of sensor device 10 and the various elements. For example, sensor devices 10 having a gap between flux concentrators 14A, 14B of about 1 micrometer could readily be manufactured using microfabrication or semiconductor techniques. Examples of suitable conventional microfabrication or semiconductor techniques include, but are not limited to, sputtering, physical vapor deposition, photolithography or other thin film processing techniques. Sensor devices 10 having a larger gap, for example about 1 mm, could readily be manufactured using sputtering, physical vapor deposition, photolithography and other microfabrication techniques or by metal foil etching or stamping. In some embodiments, a base portion of sensor device 10 may be made by microfabrication techniques and other portion(s) may be made by mechanical techniques. For example, a central portion having the proximal end regions, the coils, and a first portion of the distal end regions could be made by microfabrication techniques, and then the sensor element and a second portion (e.g., external portion) of the distal end regions could be manually added to the central portion. The magnetic sensor devices of this invention have the potential cost advantage of minimizing the cost while simultaneously maximizing the performance by adding large flux concentrators fabricated using very simple and inexpensive operations such as stamping or chemical etching to the more complicated microfabricated structure, which can also be low cost due to a large number of small devices fabricated simultaneously on a single wafer. Of course, other techniques for making sensor device 10 could also be used.

The magnetic sensor devices of this invention can be calibrated for detection of desired magnetic fields, such as, for example, an armed soldier at several hundred meters or a tank at several thousand meters, or for magnetic signal detection for medical instrumentation. The size of the overall sensor and its various element will affect the range and sensitivity of magnetic field detection.

Thus, embodiments of the HIGH SENSITIVITY MAGNETIC SENSOR are disclosed. The implementations described above and other implementations are within the scope of the following claims. One skilled in the art will appreciate that the present invention can be practiced with embodiments other than those disclosed. The disclosed embodiments are presented for purposes of illustration and not limitation, and the present invention is limited only by the claims that follow.

The use of numerical identifiers, such as "first", "second", etc. in the claims that follow is for purposes of identification and providing antecedent basis. Unless content clearly dictates otherwise, it should not be implied that a numerical identifier refers to the number of such elements required to be present in a device, system or apparatus. For example, if a device includes a first coil, it should not be implied that a second coil is required in that device.

What is claimed is:

1. A sensor device comprising:
   a base substrate;
   a first flux concentrator fixedly attached to the base substrate, the first flux concentrator comprising a first proximal end region and a first distal end region;
   a second flux concentrator fixedly attached to the base substrate, the second flux concentrator comprising a second proximal end region and a second distal end region, the first flux concentrator and the second flux concentrator positioned with the first proximal end region facing and spaced from the second proximal end region, the first proximal end region and the second proximal end region defining a gap therebetween; and
   a magnetic sensor element positioned between the first proximal end region and the second proximal end region, the sensor element moveable towards and away from the base substrate;
   wherein the sensor device comprises a first system to offset stray magnetic fields, and a second system to modulate the sensor element position relative to the base substrate.

2. The sensor device of claim 1 wherein the first system comprises a first coil wound around the first flux concentrator at its proximal end region and operably connected to a DC current source.

3. The sensor device of claim 2 wherein the first system further comprises a second coil wound around the second flux concentrator at its proximal end region and operably connected to a DC current source.

4. The sensor device of claim 1 wherein the second system comprises an actuator operably connected to the sensor element to move the sensor element towards and away from the base substrate.

5. The sensor device of claim 1 further including a third system comprising:
   a first coil wound around the first flux concentrator at its proximal end region and operably connected to an AC current source.

6. The sensor device of claim 1 wherein the magnetic sensor element is movable from a first position between the proximal ends of the flux concentrators to a second position above the proximal ends of the flux concentrators.

7. The sensor device of claim 6 wherein the length of the flux concentrators is 100 to 1000 times the gap between the distal ends of the flux concentrators.

8. The sensor device of claim 7 wherein the gap is about 1 micrometer to 2 mm.

9. A sensor device comprising:
   a base substrate;
   a first flux concentrator and a second flux concentrator fixedly attached to the base substrate, each of the concentrators having a length extending from a proximal end to a distal end, the flux concentrators positioned with the proximal ends facing and having a gap therebetween;
   a first coil wound around the first flux concentrator at its proximal end;
   a DC current source electrically connected to the first coil; and
   a magnetic sensor element positioned between the proximal ends of the flux concentrators, the sensor element moveable between the proximal ends towards and away from the base substrate.

10. The sensor device of claim 9 further comprising an actuator operably connected to the magnetic sensor element to move the sensor element towards and away from the base substrate.

11. The sensor device of claim 10 herein the magnetic sensor element is movable from a first position between the proximal ends of the flux concentrators to a second position above the proximal ends of the flux concentrators.

12. The sensor device of claim 9 further comprising an AC current source electrically connected to the first coil.

13. The sensor device of claim 12 further comprising a second coil wound around the second flux concentrator at its proximal end, an AC current source electrically connected to the second coil, and a DC current source electrically connected to the second coil.

14. The sensor device of claim 13 wherein the magnetic sensor element is positioned on a cantilever.

15. A sensor device comprising:
   a base substrate;
   a first flux concentrator and a second flux concentrator fixedly attached to the base substrate, each of the concentrators having a length extending from a proximal end to a distal end, the flux concentrators defining a gap between the proximal ends;
   a moveable magnetic sensor element positioned between the proximal ends of the flux concentrators, the magnetic sensor element movable from a first position within the gap between the proximal ends of the flux concentrators to a second position above the gap between the proximal ends of the flux concentrators; and
   an actuator element operably connected to the magnetic sensor element to move the sensor element.

16. The sensor device of claim 15 further comprising:
   a first coil wound around the first flux concentrator at its proximal end and an AC current source electrically connected to the first coil; and
   a second coil wound around the second flux concentrator at its proximal end and an AC current source electrically connected to the second coil.

17. The sensor device of claim 16 further comprising:
   a DC current source electrically connected to the first coil; and
   a DC current source electrically connected to the second coil.

18. The sensor device of claim 15 wherein the magnetic sensor element is positioned on a cantilever.

19. The sensor device of claim 15 wherein the length of the flux concentrators is 100 to 1000 times the gap between the distal ends of the flux concentrators.

20. The sensor device of claim 19 wherein the gap is about 1 micrometer to 2 mm.

* * * * *